(12) United States Patent
Shibata et al.

(10) Patent No.: US 6,982,435 B2
(45) Date of Patent: Jan. 3, 2006

(54) GROUP III NITRIDE COMPOUND SEMICONDUCTOR DEVICE AND METHOD FOR PRODUCING THE SAME

(75) Inventors: Naoki Shibata, Bisai (JP); Jun Ito, Inazawa (JP); Toshiaki Chiyo, Ama-gun (JP); Shizuyo Asami, Inazawa (JP); Hiroshi Watanabe, Ichinomiya (JP); Shinya Asami, Inazawa (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 09/985,927

(22) Filed: Nov. 6, 2001

(65) Prior Publication Data

US 2002/0070383 A1 Jun. 13, 2002

Related U.S. Application Data

(62) Division of application No. 09/522,833, filed on Mar. 10, 2000, now Pat. No. 6,342,404.

(30) Foreign Application Priority Data

Mar. 31, 1999 (JP) ................................. 11-092948

(51) Int. Cl.
   *H01L 31/0256* (2006.01)
(52) U.S. Cl. .............................. 257/76; 257/79; 257/96
(58) Field of Classification Search .................. 257/76, 257/79, 96, 103, 190, 196
   See application file for complete search history.

(56) References Cited

U.S. PATENT DOCUMENTS

| | | | | |
|---|---|---|---|---|
| 5,389,571 A | * | 2/1995 | Takeuchi et al. .............. | 117/89 |
| 5,814,239 A | * | 9/1998 | Kaneko et al. ................ | 216/63 |
| 6,011,271 A | * | 1/2000 | Sakuma et al. ................ | 257/14 |
| 6,083,841 A | * | 7/2000 | Yano et al. ................... | 438/706 |
| 6,110,277 A | * | 8/2000 | Braun .......................... | 117/94 |
| 6,153,010 A | * | 11/2000 | Kiyoku et al. ................ | 117/95 |
| 6,168,659 B1 | * | 1/2001 | Yuri et al. .................... | 117/89 |
| 6,225,650 B1 | * | 5/2001 | Tadatomo et al. ........... | 257/190 |
| 6,266,355 B1 | * | 7/2001 | Sverdlov ....................... | 372/45 |
| 6,348,096 B1 | * | 2/2002 | Sunakawa et al. ............ | 117/88 |
| 6,368,733 B1 | * | 4/2002 | Nishinaga .................... | 428/698 |
| 6,413,627 B1 | * | 7/2002 | Motoki et al. .............. | 428/332 |
| 6,420,283 B1 | * | 7/2002 | Ogawa et al. ............... | 438/796 |
| 6,478,871 B1 | * | 11/2002 | Shealy et al. ................. | 117/84 |
| 6,486,044 B2 | * | 11/2002 | Kordesch .................... | 438/482 |
| 6,580,098 B1 | * | 6/2003 | Koide .......................... | 257/103 |
| 6,682,991 B1 | * | 1/2004 | Hino et al. .................. | 438/481 |
| 2002/0022290 A1 | * | 2/2002 | Kong et al. .................... | 438/48 |
| 2002/0048964 A1 | * | 4/2002 | Yuasa et al. ................ | 438/763 |
| 2002/0148534 A2 | * | 10/2002 | Davis et al. .................. | 148/33 |

FOREIGN PATENT DOCUMENTS

| | | | |
|---|---|---|---|
| EP | 966047 | * | 12/1999 |
| EP | 1 241 702 | * | 9/2002 |
| JP | 54-16992 | * | 2/1979 |

(Continued)

*Primary Examiner*—Minhloan Tran
*Assistant Examiner*—Ahmed N. Sefer
(74) *Attorney, Agent, or Firm*—McGinn IP Law Group, PLLC

(57) ABSTRACT

A group III nitride compound semiconductor device is produced according to the following manner. A separation layer made of a material which prevents group III nitride compound semiconductors from being grown thereon is formed on a substrate. Group III nitride compound semiconductors is grown on a surface of the substrate uncovered with the separation layer while keeping the uncovered substrate surface separated by the separation layer.

24 Claims, 10 Drawing Sheets

FOREIGN PATENT DOCUMENTS

| | | | |
|---|---|---|---|
| JP | 4-175293 | * | 6/1992 |
| JP | 7-122520 | * | 5/1995 |
| JP | 7-142763 | * | 6/1995 |
| JP | 7-169715 | * | 7/1995 |
| JP | 169715 | * | 7/1995 |
| JP | 407169715 | | 7/1995 |
| JP | 7-073367 | | 10/1995 |
| JP | 7-273069 | * | 10/1995 |
| JP | 7-273367 | * | 10/1995 |
| JP | 273367 | * | 10/1995 |
| JP | 9-27612 | * | 1/1997 |
| JP | 10-312971 | * | 11/1998 |
| JP | 10-321911 | * | 12/1998 |
| JP | 11-43398 | * | 2/1999 |
| JP | 11-92296 | * | 4/1999 |
| JP | 11-145516 | * | 5/1999 |
| JP | 11-219910 | * | 8/1999 |
| JP | 2000-77336 | * | 3/2000 |
| JP | 10-233385 | * | 11/2000 |

* cited by examiner

GROUP III NITRIDE COMPOUND SEMICONDUCTOR DEVICE AND METHOD FOR PRODUCING THE SAME

This is a divisional application of U.S. application Ser. No. 09/522,833, filed on Mar. 10, 2000 now U.S. Pat. No. 6,342,404, the contents of which are incorporated herein by reference.

BACKGROUND OF THE INVENTION

1. Field of the Invention

The present invention relates to a group III nitride compound semiconductor device and a method for producing the same.

The present application is based on Japanese Patent Application No. Hei. 11-92948, which is incorporated herein by reference.

2. Description of the Related Art

A group III nitride compound semiconductor device is formed from group III nitride compound semiconductors grown on a substrate such as a sapphire substrate by a method such as an MOCVD method. On the other hand, a technique using a silicon or silicon carbide substrate inexpensive and itself electrically conductive for growing group III nitride compound semiconductor layers thereon has been examined.

In the case of a silicon substrate, however, the thermal expansion coefficient of the substrate is largely different from that of a GaN semiconductor layer. As a result, stress due to the difference between the thermal expansion coefficients may be caused in the group III nitride compound semiconductor layers in accordance with the atmospheric temperature (increased to about 1000° C.) for growth of group III nitride compound semiconductors. When things come to the worst, cracking may occur.

The problem that stress due to the difference between the thermal expansion coefficients is caused in the group III nitride compound semiconductors is not limited to the silicon substrate. This problem may be caused as a problem which must be solved when the size of a substrate is large, regardless of the material of the substrate.

SUMMARY OF THE INVENTION

The present invention is achieved in consideration of such circumstances and the configuration thereof is as follows.

That is, a method for producing a group III nitride compound semiconductor device, comprises the steps of: forming a first environment division and a second environment division on a surface of a substrate; and laminating a plurality of group III nitride compound semiconductor layers for constituting a device on said first environment division.

According to the producing method, the group III nitride compound semiconductors for constituting a device are formed only on the first environment division of the substrate. Hence, the group III nitride compound semiconductor layers are grown in small areas on the substrate individually and separately so that the areas are not connected to one another. Hence, even in the case where the thermal expansion coefficients of the group III nitride compound semiconductor layers are different from that of the substrate, stress accumulated in the inside of the group III nitride compound semiconductor layers in each area becomes small because each region for each area of the layers is small. Hence, not only is cracking, or the like, substantially prevented from occurring in each lump of the group III nitride compound semiconductor layers but also the crystallinity of the group III nitride compound semiconductor layers themselves is improved.

Further, because each lump of the group III nitride compound semiconductor layers is so small that stress is not accumulated therein regardless of the size of the substrate, the size of the substrate can be selected at option. Hence, the productivity can be improved when the size of the substrate is selected to be large.

In the above description, the material of the substrate is not particularly limited so long as the substrate can be adapted to the group III nitride compound semiconductors. Examples of the material of such a substrate may include sapphire, silicon, silicon carbide, zinc oxide, gallium phosphide, gallium arsenide, magnesium oxide, manganese oxide, etc.

Each first environment division is a portion which is provided so that single-crystal group III nitride compound semiconductors of good crystallinity are grown thereon to thereby constitute a device. If the first environment division is in a state in which the substrate is exposed, group III nitride compound semiconductors of good crystallinity can be grown thereon. Incidentally, an undercoat layer of a metal nitride (such as TiN), a metal (such as Ti), or the like, may be formed on the first environment division in advance.

The shape of the first environment division is not particularly limited so long as a device structure can be formed thereon. Taking into account the fact that the substrate must be cut into individual devices, it is preferable to make the shape of each first environment division into a rectangle. More preferably, the shape is a square. One device may be formed in each of the first environment divisions, or each of the first environment divisions may be set to be rather large so that a plurality of devices can be formed therein. The length of each side of the rectangle is selected to be in a range of from 100 to 1000 $\mu$m. If the length of each side of each first environment division is smaller than 100 $\mu$m, it is impossible to form any device. If the length of each side is contrariwise larger than 1000 $\mu$m, the group III nitride compound semiconductor layer grown therein becomes so large that there is a possibility that stress caused by the difference in expansion coefficient between the semiconductor layer and the substrate may be accumulated in the inside of the group III nitride compound semiconductor layer. More preferably, the length of each side of the rectangle of each first environment division is selected to be in a range of from 200 to 800 $\mu$m. In an embodiment, each first environment division is shaped like a square and the length of each side of the square is selected to be 350 $\mu$m which is equal to that in an existing product (light-emitting diode) sold by this applicant.

Incidentally, if corner portions of the rectangle of each first environment division are rounded off, that is, if corner portions of the rectangle are chamfered, stress to be applied to the group III nitride compound semiconductor layer is relaxed so that the crystallinity thereof is improved more greatly.

The second environment division prevents group III nitride compound semiconductors for constituting devices from being grown thereon, so that the group III nitride compound semiconductor layer lumps grown on the first environment divisions for constituting devices respectively are separated from one another by the second environment division. In other words, the group III nitride compound semiconductor layer lumps for constituting devices respectively are grown individually separately on the first environment divisions by the presence of the second environment division.

As a first mode for achieving the above description, the second environment division is made of a material such as silicon oxide, silicon nitride, or the like, on which group III nitride compound semiconductors cannot be grown. That is, the group III nitride compound semiconductor lumps grown on the first environment divisions respectively are separated from one another by a silicon oxide or silicon nitride layer formed on the substrate. The thickness of the separation layer is preferably set to be slightly larger than the designed thickness of the group III nitride compound semiconductor layer so that the group III nitride compound semiconductor lumps are not connected to one another, that is, are grown individually separately.

As another mode, the second environment division is provided so that a group III nitride compound semiconductor can be grown on the second environment division but the group III nitride compound semiconductor is made different in crystallinity (inclusive of an amorphous state) from the group III nitride compound semiconductors (for constituting devices) grown on the first environment divisions. That is, if the group III nitride compound semiconductor grown on the second environment division is inferior in crystallinity to that grown on the first environment division, internal stress due to the difference in thermal expansion coefficient from the substrate is concentrated in the structurally fragile group III nitride compound semiconductor layer grown on the second environment division so that stress can be prevented from being accumulated in the group III nitride compound semiconductor layer grown on the first environment division. In view from a different angle, if cracking is intentionally generated in the group III nitride compound semiconductor layer grown on the second environment division, the group III nitride compound semiconductor layer lumps grown on the first environment divisions are separated from one another to form small growth regions respectively so that stress can be prevented from being accumulated largely.

In other words, the above fact can be achieved if each of the first environment divisions, which is a region for the growth of the group III nitride compound semiconductor, is surrounded by the second environment division made of a material different in kind from that of the first environment division. When the first environment division is constituted by exposed portions of the substrate, a nitride compound such as BN, TiN, VN, CrN, ZrN, NbN, HfN, TaN, or the like, or an oxide compound such as $TiO_X$, $VO_X$, $CrO_X$, $ZrO_X$, $TaO_X$, or the like, may be used as the material for constituting the second environment division in this mode.

Further, the surface of the substrate in the second environment division may be roughened. This is because any good crystal is not grown on the roughened substrate surface. Further, a level difference may be preferably provided between the second environment division having such a rough surface and the first environment division having a mirror surface suitable for the crystal growth of the group III nitride compound semiconductor. Hence, the unification of the group III nitride compound semiconductor grown on the first environment division with the group III nitride compound semiconductor grown on the second environment division is lowered so that greater independence is given to the growth of the group III nitride compound semiconductor on each of the first environment divisions.

The second environment division having such a roughened surface is formed by wet etching, scribing, half-cutting by a dicing blade, or the like.

Further, the substrate surface corresponding to the second environment division may be made amorphous by flowing ions into the substrate surface.

The width of the second environment division surrounding each first environment division is not particularly limited.

When the second environment division is constituted by a separation layer of silicon oxide, or the like, the substrate together with the separation layer may be cut into individual devices so that side faces of the group III nitride compound semiconductor layer can be protected by the remaining separation layer. In this case, the width of the separation layer needs to be larger than the width of the dicing blade. Further, when the separation layer is removed from each device, the substrate is exposed in the removed portion. When an after-process is to be applied to the exposed portion of the substrate to thereby provide another function (such as attachment of a bonding pad, or the like), it is significant from the point of view of improvement in the degree of freedom for designing the after-process that the thickness of the separation layer can be selected at option.

Each of the group III nitride compound semiconductors is represented by the general formula $Al_XGa_YIn_{1-X-Y}N$ ($0 \leq X \leq 1, 0 \leq Y \leq 1, 0 \leq X+Y \leq 1$), which may further contain group III elements such as boron (B) and thallium (Tl) and in which the nitrogen (N) may be partially replaced by phosphorus (P), arsenic (As), antimony (Sb) or bismuth (Bi). Each of the group III nitride compound semiconductors may contain an optional dopant.

The method for forming the group III nitride compound semiconductor layers is not particularly limited but, for example, each of the layers may be formed by a known metal organic chemical vapor deposition method (called "MOCVD method" in this specification). Alternatively, each of the layers may be formed by a known molecular beam epitaxy method (MBE method), a halide vapor phase epitaxy method (HVPE method), or the like.

When the second environment division is constituted by a separation layer of silicon oxide, or the like, the exposed substrate surface in the first environment division is in a so-called "valley floor" state by the presence of the separation layer. To form group III nitride compound semiconductor layers on such a substrate surface efficiently by an MOCVD method, at least a carrier gas such as nitrogen, hydrogen, or the like, is supplied by being sprayed substantially perpendicularly onto the substrate surface. As a result, an ammonia gas and gasses of materials such as TMG, etc. can be supplied to the substrate surface efficiently. It is a matter of course that the source gasses are preferably supplied so as to be sprayed perpendicularly onto the substrate surface.

Features and advantages of the invention will be evident from the following detailed description of the preferred embodiments described in conjunction with the attached drawings.

DETAILED DESCRIPTION OF THE PREFERRED EMBODIMENTS

Embodiments of the present invention will be described below with reference to the drawings.

(First Embodiment)

FIG. 1 is a process view showing the outline of a producing method according to an embodiment.

Figure 1A:
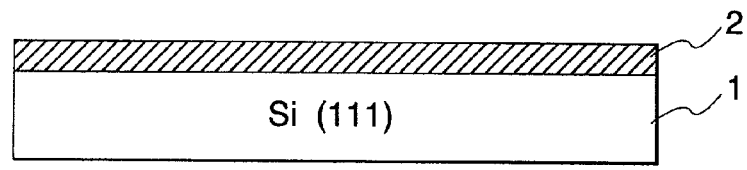
FIGS. 1A to 1E show a process view showing a producing method according to a first embodiment of this invention.

In this embodiment, a silicon substrate 1 (diameter: 2 inches) is prepared and a silicon oxide layer 2 for constituting a second environment division is formed on a (111) face of the substrate 1 by a CVD method (see FIG. 1A). The thickness of the silicon oxide layer 2 is set to be about 5.5 μm.

Figure 1B:
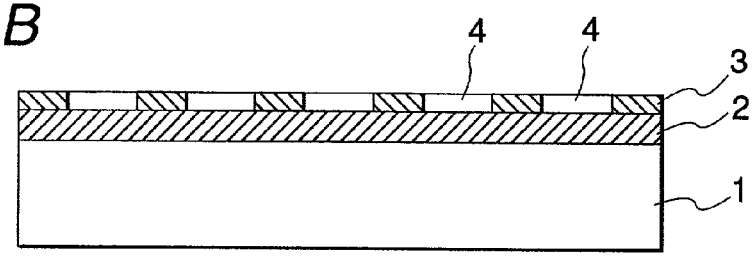
Figure 1C:
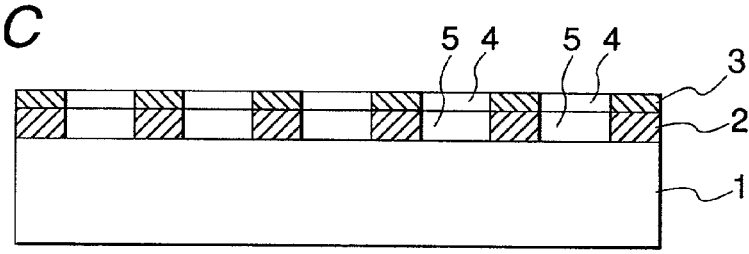

Then, as shown in FIG. 1B, a mask layer 3 is formed as a pattern on the silicon oxide layer 2, and the silicon oxide layer 2 is subjected to wet etching through opening portions 4 of the mask layer 3. Consequently, as shown in FIG. 1C, opening portions 5 for constituting first environment divisions are formed in the silicon oxide layer 2, so that the silicon substrate 1 is exposed in the opening portions 5.

Figure 1D:
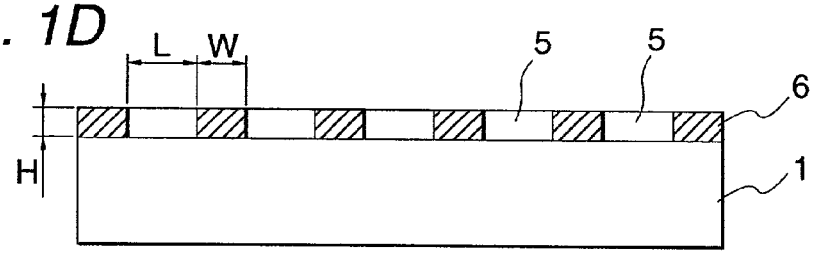
Figure 1E:
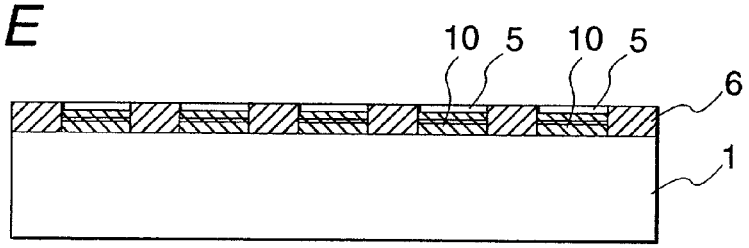

Then, as shown in FIG. 1D, the mask layer 3 is removed. Consequently, the silicon oxide layer having the opening portions 5 form a separation layer 6.

Figure 2:
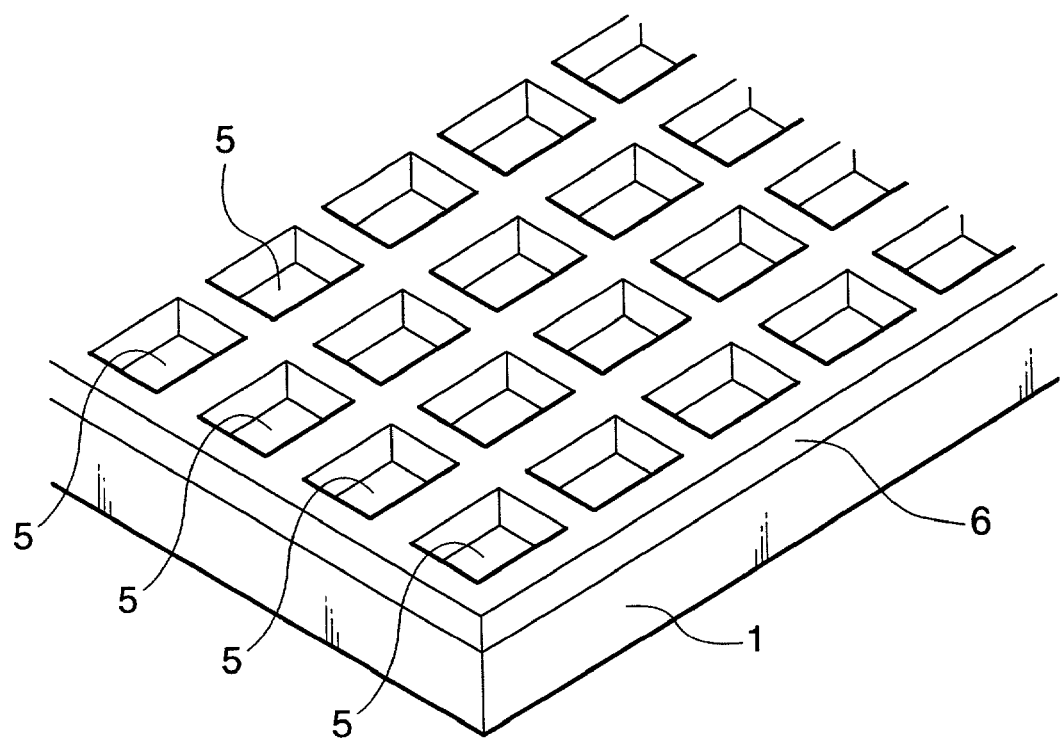
FIG. 2 is a perspective view showing a separation layer which forms a second environment division in the first embodiment.

FIG. 2 is a perspective view of FIG. 1D. As shown in FIG. 2, each of the opening portions 5 in this embodiment is shaped like a square. The length L of each side of the square is 350 μm. Because the total thickness of all the group III nitride compound semiconductor layers for constituting a device structure of a light-emitting diode is about 5 μm, the thickness H of the separation layer 6 is set to be 5.5 μm which is larger than the total thickness of the semiconductor layers. The width W of the separation for separating the opening portions 5 from one another is set to be 50 μm. But this width W is not always particularly limited to such a value.

Figure 3:
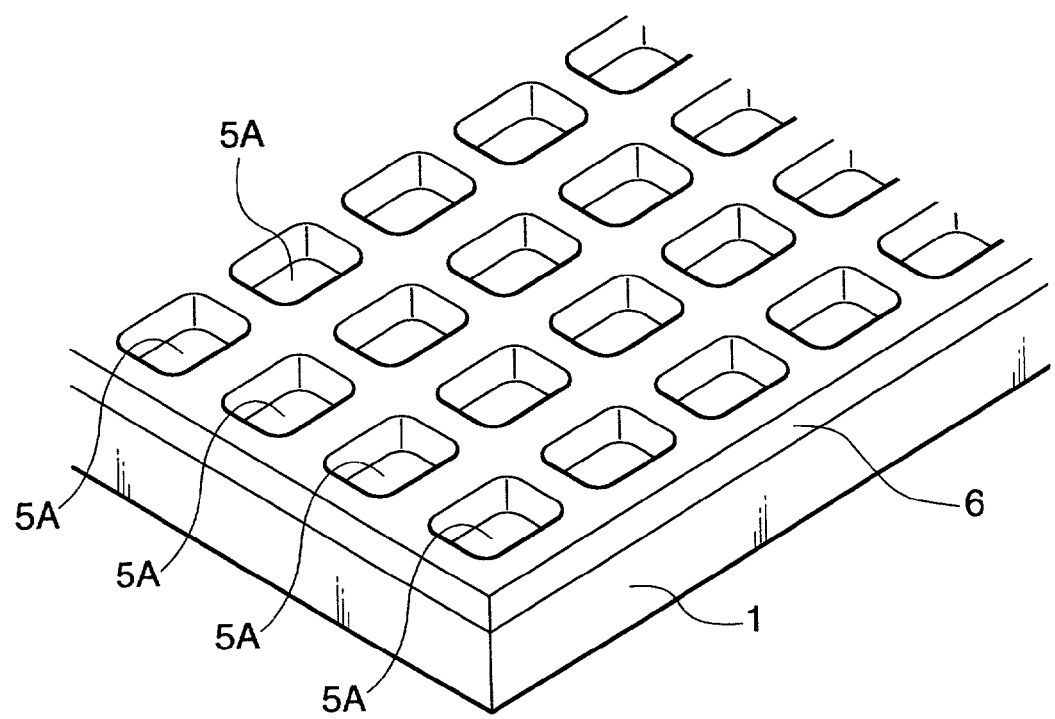
FIG. 3 is a perspective view showing a separation layer in another example.

As shown in FIG. 3, it is also preferable that corner portions of each opening portion 5A are rounded off. There is a possibility that the growth of group III nitride compound semiconductors may be uneven in right-angled corner. This is further because stress is apt to be concentrated in the right-angled corner portions so that there is a possibility that crystallinity in the corner portions may be spoiled.

Then, a plurality of group III nitride compound semiconductor layers are grown in each of the opening portions 5 by a general MOCVD method to thereby complete device structures 10 of light-emitting diodes.

An example of the device structure 10 of this type will be described with reference to FIG. 4.

Specifications of respective layers are as follows.

| Layer | Composition | Dopant | (Thickness) |
|---|---|---|---|
| p-type clad layer 18 | p-GaN | Mg | (0.3 μm) |
| Light-emitting layer 17 | superlattice structure | | |
| Quantum well layer | $In_{0.15}Ga_{0.85}N$ | | (35 Å) |
| Barrier layer | GaN | | (35 Å) |
| The number of repeated quantum well and barrier layers: 1 to 10 | | | |
| n-type clad layer 16 | n-GaN | Si | (4 μm) |
| Buffer layer 15 | $Al_{0.9}Ga_{0.1}N$ | Si | (150 Å) |
| Substrate 11 | Si (111) | | (300 μm) |

The n-type clad layer 16 may be of a double-layered structure with an n⁻ layer of a low electron density on the light-emitting layer 17 side and an n⁺ layer of a high electron density on the buffer layer 15 side.

The light-emitting layer 17 is not limited to the superlattice structure but a single hetero type, a double hetero type, a homo-junction type, or the like, may be used as this light-emitting layer.

An $Al_XGa_YIn_{1-X-Y}N$ (inclusive of X=0, Y=0, X=Y=0) layer, which has a wide band gap and which is doped with an acceptor such as magnesium, or the like, may be interposed between the light-emitting layer 17 and the p-type clad layer 18. This technique is employed for preventing electrons flown into the light-emitting layer 17 from being diffused into the p-type clad layer 18.

The p-type clad layer 18 may be of a double-layered structure with a p⁻ layer of a low hole density on the light-emitting layer 17 side and a p⁺ layer of a high hole density on the electrode side.

The buffer layer 15 of $Al_aGa_{1-a}N$ (0≦a≦1) is grown on the silicon (111) substrate having a patterned silicon oxide layer at a growth temperature of 1000° C. In the condition that the temperature is kept at 1000° C., the n-type clad layer 16 and layers following the n-type clad layer 16 are formed by an ordinary method (MOCVD method). In this growth method, an ammonia gas and gasses of group III alkyl compounds such as trimethylgallium (TMG), trimethylaluminum (TMA), and trimethylindium (TMI) are supplied to the substrate that has been heated to an appropriate temperature and are subjected to a thermal decomposition reaction to thereby make a desired crystal grown on the substrate.

Alternatively, each of the group III nitride compound semiconductor layers may be formed by an MBE method.

A light-transparency electrode 19, which is constituted by a thin film containing gold, is laminated to cover the substantially whole area of an upper face of the p-type clad layer 18. A p-type electrode 20, which is constituted also by a material containing gold, is formed on the light-transparency electrode 19 by evaporation.

Incidentally, the n-type electrode is formed on the Si substrate layer 11. Further, wire is bonded to a desired position of the Si substrate layer 11.

Then, the substrate is cut and divided, at the approximately center of the separation layer 6, into respective device structures 10.

According to the light-emitting device configured as described above, all side faces of each device structure 10 is surrounded by the silicon oxide layer 6. Hence, each device structure 10 is protected physically and chemically.

In this embodiment, one device structure 10 is formed in one opening portion 5. Accordingly, when the substrate is cut at the separation layer 6, all side faces of each device structure 10 is protected by the silicon oxide layer (protective layer 6). Incidentally, it is a matter of course that, when a plurality of device structures are formed in each opening portion 5, no portion but portions abutting on the separation layer 6 is protected by the separation layer 6.

A dicing blade, however, may reach the group III nitride compound semiconductor crystal at the time of cutting into devices if the separation layer is too narrow. This can be neglected if there is no problem in reliability empirically.

Figure 5:
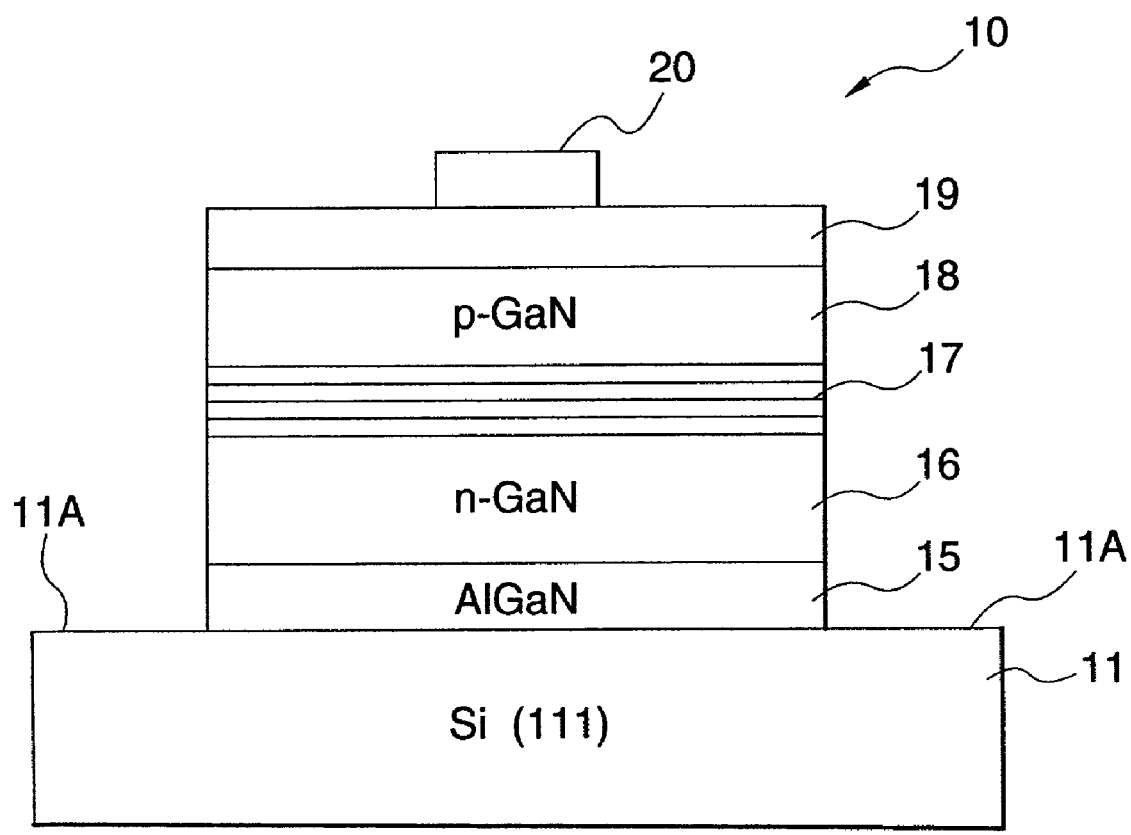
FIG. 5 is a sectional view showing the configuration of a semiconductor device according to another example.

FIG. 5 shows a device in a state in which the silicon oxide layer 6 is removed. In this device, the substrate 11 is exposed at its outer circumferential portion 11A in the form of a belt. Hence, the exposed portion 11A of the substrate 11 can be used for application of another process to the substrate. When the exposed portion 11A is set to be large, another semiconductor device, or the like, can be formed on the exposed portion 11A. Moreover, an electrode pad can be formed on the exposed portion 11A.

The silicon oxide layer 6 may be removed before the substrate is cut into respective device structures 10. That is, the silicon oxide layer 6 may be removed with hydrofluoric acid, or the like, in the condition shown in FIG. 1E and then the substrate may be cut and divided into respective device structures 10.

Figure 6:
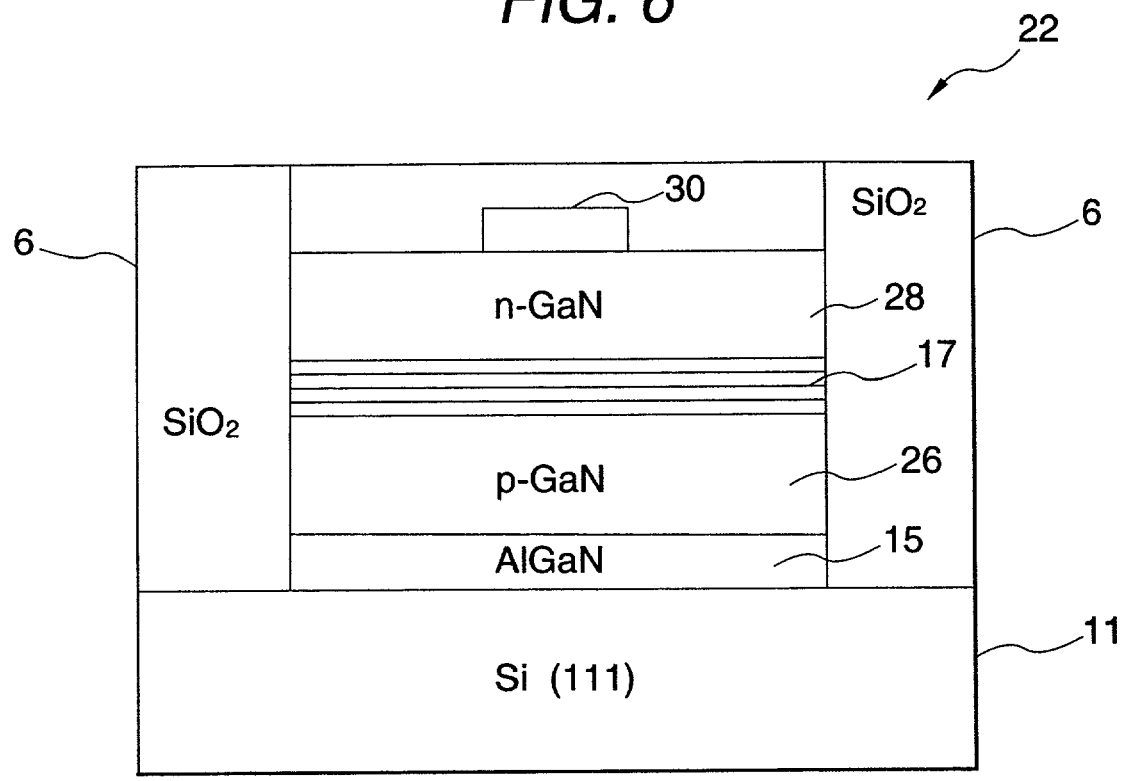
FIG. 6 is a sectional view showing the configuration of a semiconductor device according to a further example.

FIG. 6 shows a semiconductor device as another example of this embodiment. Incidentally, the same parts as shown in FIG. 4 are referenced correspondingly so that the description thereof will be omitted.

Specifications of respective layers are as follows.

| Layer | Composition | Dopant | (Thickness) |
|---|---|---|---|
| n-type clad layer 28 | n-GaN | Si | (0.3 μm) |
| light-emitting layer 17 | superlattice structure | | |
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| p-type clad layer 26 | p-GaN | Mg | (4 μm) |
| Buffer layer 15 | $Al_{0.9}Ga_{0.1}N$ | | (150 Å) |
| Substrate 11 | Si (111) | | (300 μm) |

As shown in FIG. 6, the p-type clad layer 26, the light-emitting layer 17 and the n-type clad layer 28 are grown successively on the buffer layer 15 to thereby form a device structure 22 for a light-emitting diode. In the case of this device structure 22, the light-transmissible electrode (see the reference numeral 19 in FIG. 4) can be omitted because the n-type clad layer 28 of low resistance forms the uppermost face.

In FIG. 6, the reference numeral 30 designates an n-type electrode. The Si substrate 11 itself can be used as a p-type electrode.

Figure 7:
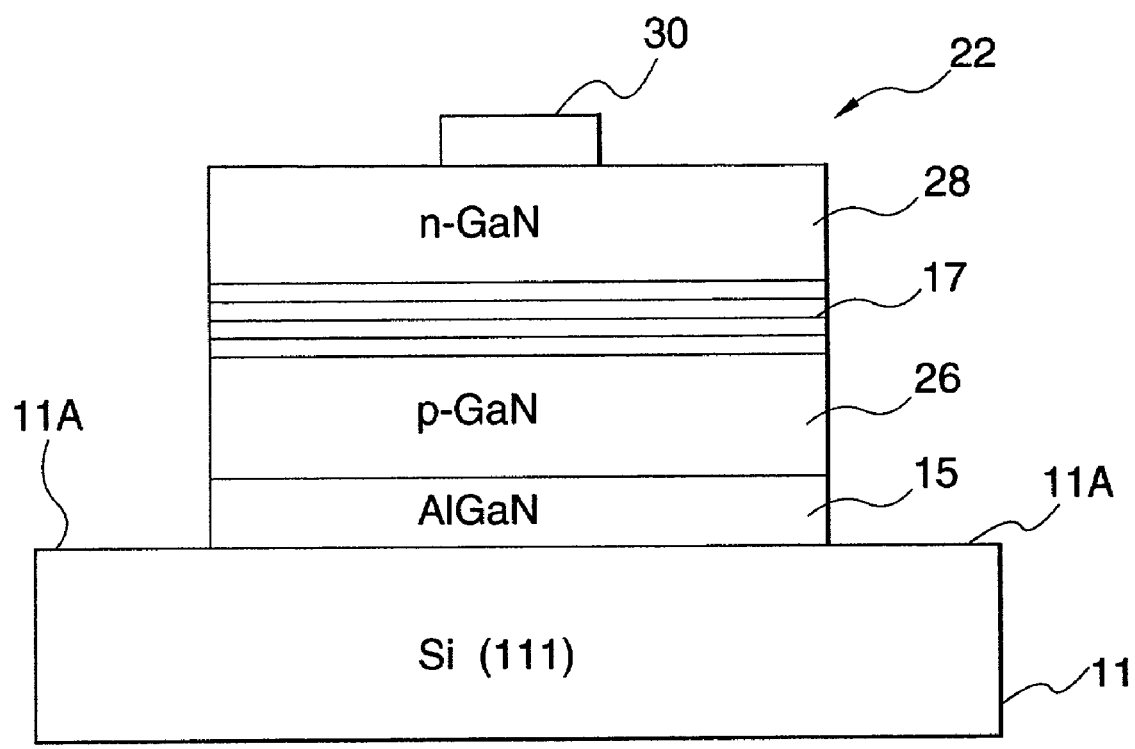
FIG. 7 is a sectional view showing the configuration of a semiconductor device according to a further example.

FIG. 7 shows a device in a state in which the silicon oxide layer 6 is removed. In this device, the substrate 11 is exposed at its outer circumferential portion 11A in the form of a belt. Hence, the exposed portion 11A of the substrate 11 can be used for application of another process to the substrate. When the exposed portion 11A is set to be large, another semiconductor device, or the like, can be formed on the exposed portion 11A. Moreover, an electrode pad can be formed on the exposed portion 11A.

The silicon oxide layer 6 may be removed before the substrate is cut and divided into respective device structures 22. That is, the silicon oxide layer 6 may be removed with hydrofluoric acid, or the like, in the condition shown in FIG. 1E and then the substrate may be cut and divided into respective device structures 22.

Figure 8:
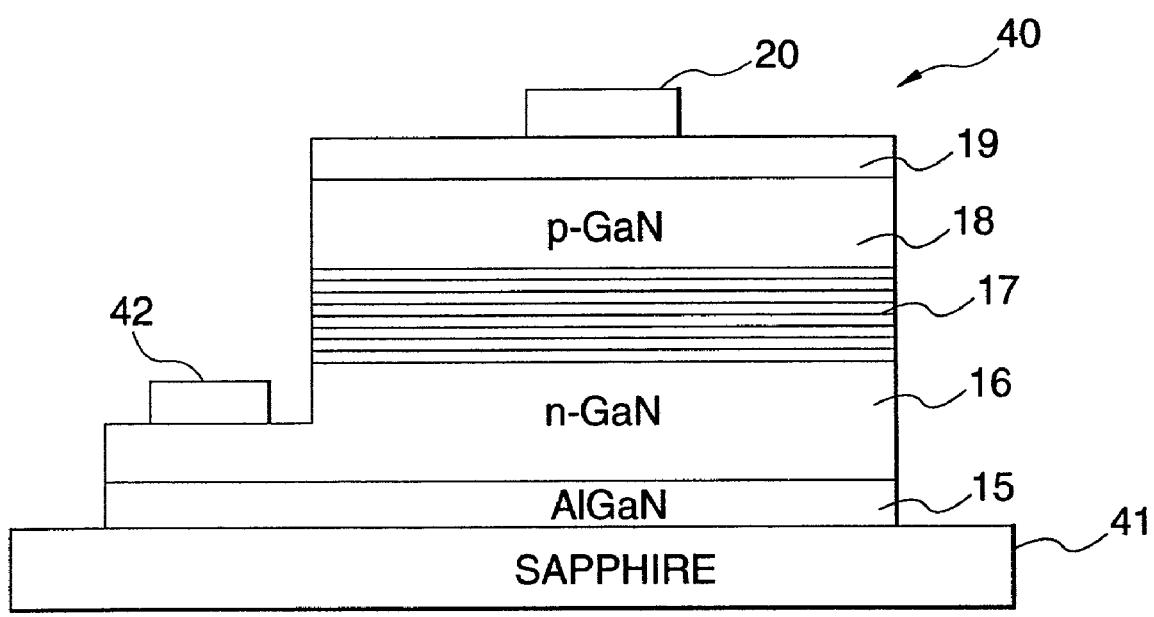
FIG. 8 is a sectional view showing the configuration of a semiconductor device according to a further example.

FIG. 8 shows a further example of the present invention. In this example, sapphire is used as the substrate. Incidentally, the same parts as shown in FIG. 4 are referenced correspondingly and the description thereof will be omitted.

Specifications of respective layers are as follows.

| Layer | Composition | Dopant | (Thickness) |
|---|---|---|---|
| p-type clad layer 18 | p-GaN | Mg | (0.3 μm) |
| light-emitting layer 17 | superlattice structure | | |
| quantum well layer | $In_{0.15}Ga_{0.85}N$ | | (35 Å) |
| barrier layer | GaN | | (35 Å) |
| the number of repeated quantum well and barrier layers: 1 to 10 | | | |
| n-type clad layer 16 | n-GaN | Si | (4 μm) |
| Buffer layer 15 | $Al_{0.9}Ga_{0.1}N$ | | (150 Å) |
| Substrate 41 | sapphire | | (300 μm) |

The buffer layer 15 and layers upper than the buffer layer 15 are formed by an ordinary method (MOCVD method). The reference numeral 42 designates an n-type electrode.

Figure 4:
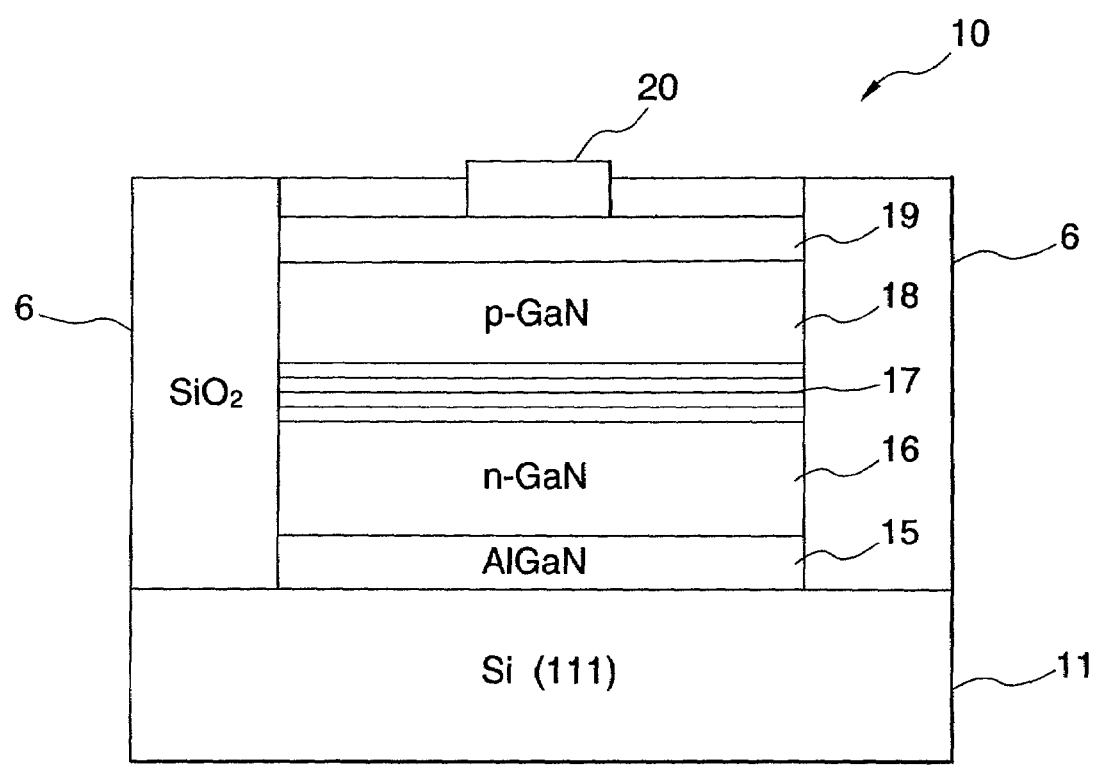
FIG. 4 is a sectional view showing the configuration of a semiconductor device according to a first embodiment.

Although FIG. 8 shows the case where the silicon oxide layer 6 is removed, the step of removing the silicon oxide layer 6 may be omitted so that a configuration in which the group III nitride compound semiconductor layers are protected by the silicon oxide layer 6 can be employed like FIGS. 4 and 6.

(Second Embodiment)

A producing method according to another embodiment of this invention will be described.

Figure 9A:
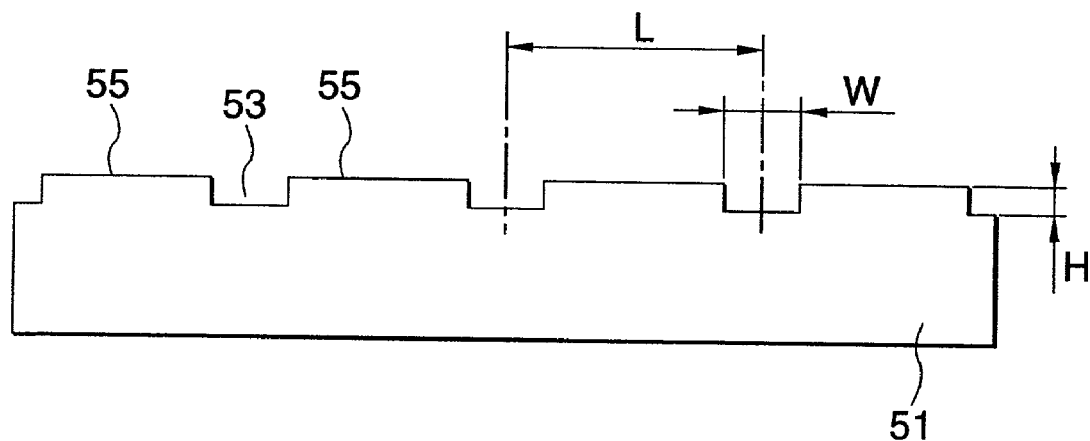
FIGS. 9A and 9B show a process view showing a producing method according to a second embodiment.

As shown in FIG. 9A, for example, grooves 53 with a width W of about 25 μm and a depth H of from about 5 to about 10 μm at intervals L of 350 μm are formed in x and y directions, in a surface of a silicon substrate 51 by using half-cutting by means of a dicing blade. Thus, square portions (first environment divisions) 55 with each side about 325 μm long are formed so as to be surrounded by the 25 μm-wide grooves 53 in four directions. Each of the square portions 55 has a shape and size corresponding to the shape of a semiconductor device.

Incidentally, bottom and side faces of the grooves 53 are roughened by half-cutting by means of a dicing blade.

Figure 9B:
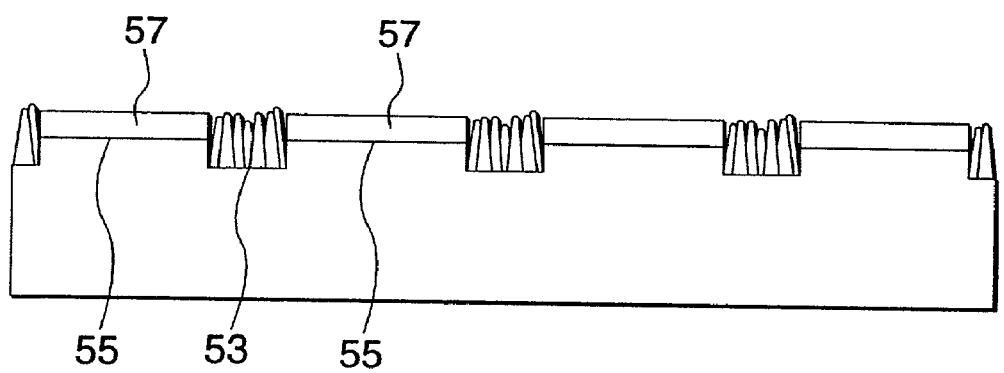
Figure 10:
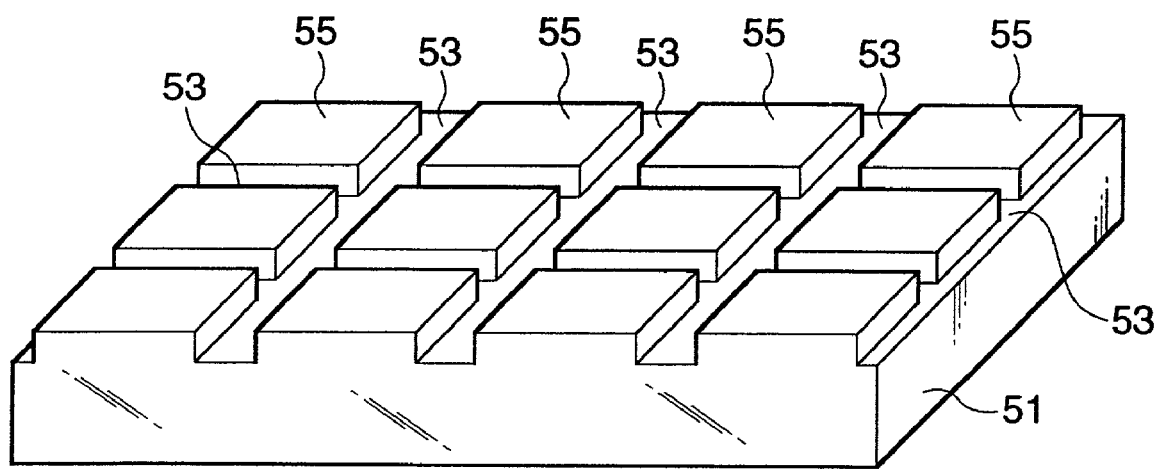
FIG. 10 is a perspective view showing grooves which form a second environment division.

When a group III nitride compound semiconductor is grown on the substrate 51 provided with such grooves 53, a single crystal group III nitride compound semiconductor layer 57 of good crystallinity is grown on each square portion 55 as shown in FIG. 9B. On the other hand, the group III nitride compound semiconductor is grown columnarly on each groove 53. As a result, the group III nitride compound semiconductor layer lumps 57 are formed individually on portions of the substrate so that they are not connected to one another.

Hence, even in the case where the thermal expansion coefficient of the group III nitride compound semiconductor 57 is different from that of the substrate 51, stress accumulated in the inside of each group III nitride compound semiconductor 57 is reduced because the group III nitride compound semiconductor-forming region is small. Hence, each crystallinity of the group III nitride compound semiconductor layer 57 is improved because cracking is prevented from occurring in the group III nitride compound semiconductor layer 57.

The grooves 53 for forming a second environment division may be formed by wet etching, scribing, or the like, other than the aforementioned half-cutting. Further, the second environment division may be formed by implanting ions into portions of the substrate corresponding to the grooves 53 to thereby make the portions amorphous.

Any other method may be used so long as the method is a method for changing the substrate surface or a method for changing the crystal structure of the substrate surface.

The device-forming method such as a method for forming the group III nitride compound semiconductor layers 57, or the like, and the configuration of the device are the same as those described in the previous embodiment.

The device to which the present invention is applied is not limited to the aforementioned light-emitting diode. The present invention may be applied also to optical devices such as a photodetector, a laser diode, a solar cell, etc., bipolar devices such as a rectifier, a thyristor, a transistor, etc., unipolar devices such as an FET, etc., and electronic devices such as a microwave device, etc.

The present invention may be further applied to laminates which are intermediates of these devices.

This invention is not limited to the aforementioned description of the mode for carrying out the invention and the embodiments thereof at all, and includes various modifications that can be conceived by those skilled in the art without departing from the scope of claim for a patent.

The following facts will be disclosed.

(11) A producing method according to the present invention, wherein the material which prevents the group III nitride compound semiconductors from being grown thereon is silicon oxide or silicon nitride.

(12) A producing method according to the present invention, wherein the second environment division is in a state in which the surface of the substrate is roughened.

(13) A producing method according to the paragraph (12), wherein the first environment division is different in the height of the substrate surface from the second environment division.

(14) A producing method according to the present invention, wherein the second environment division is constituted by a level difference formed by wet etching, scribing or half-cutting due to a dicing blade.

(15) A producing method according to the present invention, wherein the second environment division is in a state in which the substrate is amorphous.

(16) A producing method according to the paragraph (15), wherein the second environment division is made amorphous by ion implantation.

(17) A producing method according to any one of claims 1 through 4 and the paragraphs (11) through (16), wherein the first environment division corresponds to a device unit and is surrounded by the second environment division.

(18) A producing method according to the paragraph (17), wherein the first environment division is shaped like a rectangle.

(19) A producing method according to the paragraph (18), wherein corners of the rectangle are rounded off.

(20) A producing method according to the paragraph (17) or (18), wherein the length of each side of the rectangle is in a range of from 100 to 1000 $\mu$m.

(21) A producing method according to any one of the paragraphs (16) through (20), wherein the substrate is separated into devices corresponding to functional units by the second environment division.

(31) On a substrate on which first and second environment divisions are formed, a group III nitride compound semiconductor device comprising a group III nitride compound semiconductor layer formed on the first environment division so as to serve as an effective semiconductor layer.

(32) A device according to the paragraph (31), wherein the first environment division is in a state in which a surface of the substrate is exposed before the group III nitride compound semiconductor layer is formed.

(33) A device according to the paragraph (32), wherein the second environment division is made of a material which prevents the group III nitride compound semiconductor from being grown on the material.

(34) A device according to the paragraph (32), wherein a second group III nitride compound semiconductor layer, which is amorphous or different in crystallinity from the group III nitride compound semiconductor layer grown on the first environment division, is grown on the second environment division.

(35) A device according to the paragraph (33), wherein the material which prevents the group III nitride compound semiconductors from being grown thereon is silicon oxide or silicon nitride.

(36) A device according to the paragraph (34), wherein the second environment division is in a state in which the surface of the substrate is roughened.

(37) A device according to the paragraph (36), wherein the first environment division is different in the height of the substrate surface from the second environment division.

(38) A device according to the paragraph (34), wherein the second environment division is constituted by a level difference formed by wet etching, scribing or half-cutting due to a dicing blade.

(39) A device according to the paragraph (34), wherein the second environment division is in a state in which the substrate is amorphous.

(40) A device according to the paragraph (39), wherein the second environment division is made amorphous by ion implantation.

(41) A device according to any one of the paragraphs (31) through (40), wherein the first environment division corresponds to a device unit and is surrounded by the second environment division.

(42) A device according to the paragraph (41), wherein the first environment division is shaped like a rectangle.

(43) A device according to the paragraph (42), wherein corners of the rectangle are rounded off.

(44) A device according to the paragraph (41) or (42), wherein the length of each side of the rectangle is in a range of from 100 to 1000 $\mu$m.

(45) A device according to any one of the paragraphs (40) through (44), wherein the substrate is separated into devices corresponding to functional units by the second environment division.

(51) A method for producing a laminate, comprising the steps of: forming a first environment division and a second environment division on a surface of a substrate; and laminating a plurality of group III nitride compound semiconductor layers for constituting a device on said first environment division.

(52) A producing method according to the paragraph (51), wherein said first environment division is in a state in which said substrate surface is exposed.

(53) A producing method according to the paragraph (52), wherein said second environment division is made of a material which prevents said group III nitride compound semiconductors from being grown on said material.

(54) A producing method according to the paragraph (52), wherein a second group III nitride compound semiconductor layer, which is amorphous or different in crystallinity from said group III nitride compound semiconductor layers grown on said first environment division, is grown on said second environment division.

(55) A producing method according to the paragraph (53), wherein the material which prevents the group III nitride compound semiconductors from being grown thereon is silicon oxide or silicon nitride.

(56) A producing method according to the paragraph (54), wherein the second environment division is in a state in which the surface of the substrate is roughened.

(57) A producing method according to the paragraph (56), wherein the first environment division is different in the height of the substrate surface from the second environment division.

(58) A producing method according to the paragraph (54), wherein the second environment division is constituted by a level difference formed by wet etching, scribing or half-cutting due to a dicing blade.

(59) A producing method according to the paragraph (54), wherein the second environment division is in a state in which the substrate is amorphous.

(60) A producing method according to the paragraph (59), wherein the second environment division is made amorphous by ion implantation.

(61) A producing method according to any one of the paragraphs (51) through (60), wherein the first environment division corresponds to a device unit and is surrounded by the second environment division.

(62) A producing method according to the paragraph (61), wherein the first environment division is shaped like a rectangle.

(63) A producing method according to the paragraph (62), wherein corners of the rectangle are rounded off.

(64) A producing method according to the paragraph (61) or (62), wherein the length of each side of the rectangle is in a range of from 100 to 1000 $\mu$m.

(65) A producing method according to any one of the paragraphs (60) through (64), wherein the substrate is separated into devices corresponding to functional units by the second environment division.

(71) On a substrate on which first and second environment divisions are formed, a laminate comprising a group III nitride compound semiconductor layer formed on the first environment division so as to serve as an effective semiconductor layer.

(72) A laminate according to the paragraph (71), wherein the first environment division is in a state in which a surface of the substrate is exposed before the group III nitride compound semiconductor layer is formed.

(73) A laminate according to the paragraph (72), wherein the second environment division is made of a material which prevents the group III nitride compound semiconductor from being grown on the material.

(74) A laminate according to the paragraph (73), wherein a second group III nitride compound semiconductor layer, which is amorphous or different in crystallinity from the group III nitride compound semiconductor layer grown on the first environment division, is grown on the second environment division.

(75) A laminate according to the paragraph (73), wherein the material which prevents the group III nitride compound semiconductors from being grown thereon is silicon oxide or silicon nitride.

(76) A laminate according to the paragraph (74), wherein the second environment division is in a state in which the surface of the substrate is roughened.

(77) A laminate according to the paragraph (76), wherein the first environment division is different in the height of the substrate surface from the second environment division.

(78) A laminate according to the paragraph (74), wherein the second environment division is constituted by a level difference formed by wet etching, scribing or half-cutting due to a dicing blade.

(79) A laminate according to the paragraph (74), wherein the second environment division is in a state in which the substrate is amorphous.

(80) A laminate according to the paragraph (79), wherein the second environment division is made amorphous by ion implantation.

(81) A laminate according to any one of the paragraphs (71) through (80), wherein the first environment division corresponds to a device unit and is surrounded by the second environment division.

(82) A laminate according to the paragraph (81), wherein the first environment division is shaped like a rectangle.

(83) A laminate according to the paragraph (82), wherein corners of the rectangle are rounded off.

(84) A laminate according to the paragraph (81) or (82) wherein the length of each side of the rectangle is in a range of from 100 to 1000 $\mu$m.

(85) A laminate according to any one of the paragraphs (80) through (84), wherein the substrate is separated into devices corresponding to functional units by the second environment division.

(91) A method for producing group III nitride compound semiconductor devices, comprising the steps of:
  forming, on a substrate, a separation layer of a material which prevents group III nitride compound semiconductors from being grown thereon; and
  laminating a plurality of group III nitride compound semiconductor layers on each of portions of the substrate uncovered with the separation layer while keeping the uncovered substrate surface separated by the separation layer.

(92) A producing method according to the paragraph (91), wherein the separation layer has opening portions corresponding to device units so that the group III nitride compound semiconductors are grown in the opening portions respectively.

(93) A producing method according to the paragraph (92), wherein the substrate together with the separation layer is divided into devices by functional units.

(94) A producing method according to the paragraph (92), wherein the substrate is divided into devices by functional units after the separation layer is removed.

(95) A producing method according to the paragraph (92), wherein each of the opening portions is shaped like a rectangle.

(96) A producing method according to the paragraph (95), wherein corners of each of the quadrilateral opening portions are rounded off.

(97) A method for producing group III nitride compound semiconductor devices, comprising the steps of:
  forming, on a substrate, a separation layer which is made of silicon nitride or silicon oxide and which has a plurality of opening portions each shaped like a rectangle with each side having a length of from 100 to 1000 $\mu$m; and
  forming GaN semiconductor layer lumps in the opening portions respectively individually.

(98) A group III nitride semiconductor device comprising:
  a substrate;
  a device structure which is constituted by group III nitride compound semiconductors formed on the substrate; and a protective layer which is formed on the substrate and which is made of silicon nitride or silicon oxide for protecting at least one side face of the device structure.

(99) A device according to the paragraph (98), wherein the device structure is surrounded by the protective layer.

(101) A method for producing laminates, comprising the steps of:

forming, on a substrate, a separation layer of a material which prevents group III nitride compound semiconductors from being grown thereon; and laminating a plurality of group III nitride compound semiconductor layers on each of portions of the substrate uncovered with the separation layer while keeping the uncovered substrate surface separated by the separation layer.

(102) A producing method according to the paragraph (101), wherein the separation layer has opening portions corresponding to device units so that the group III nitride compound semiconductors are grown in the opening portions respectively.

(103) A producing method according to the paragraph (102), wherein the substrate together with the separation layer is divided into devices by functional units.

(104) A producing method according to the paragraph (102), wherein the substrate is divided into devices by functional units after the separation layer is removed.

(105) A producing method according to the paragraph (102), wherein each of the opening portions is shaped like a rectangle.

(106) A producing method according to the paragraph (105), wherein corners of each of the quadrilateral opening portions are rounded off.

(107) A method for producing laminates, comprising the steps of:

forming, on a substrate, a separation layer which is made of silicon nitride or silicon oxide and which has a plurality of opening portions each shaped like a rectangle with each side having a length of from 100 to 1000 $\mu$m; and forming GaN semiconductor layer lumps in the opening portions respectively individually.

(108) A laminate comprising:

a substrate;

a group III nitride compound semiconductor layer which is formed on the substrate; and a protective layer which is formed on the substrate and which is made of silicon nitride or silicon oxide for protecting at least one side face of the group III nitride compound semiconductor layer.

(109) A laminate according to the paragraph (108), wherein the group III nitride compound semiconductor layer is surrounded by the protective layer.

(111) A method for producing group III nitride compound semiconductor devices, comprising the steps of: forming, on a substrate, a separation region having a surface state in which single-crystal group III nitride compound semiconductors are not grown thereon; forming single crystals of group III nitride compound semiconductors on a remaining region of the substrate surface except the separation region; and forming, on the separation region, a group III nitride compound semiconductor material having another crystal structure inclusive of an amorphous structure except the single crystal structure.

(112) A method according to the paragraph (111), wherein the separation region is formed by forming a level difference on the substrate by wet etching, by forming a level difference on the substrate by scribing or half-cutting due to a dicing blade, or by making the substrate amorphous by ion implanting.

(113) A producing method according to the paragraph (111) or (112), wherein the substrate together with the separation region is divided into devices by functional units.

(121) A method for producing laminates, comprising the steps of: forming, on a substrate, a separation region having a surface state in which single-crystal group III nitride compound semiconductors are not grown thereon; forming single crystals of group III nitride compound semiconductors on a remaining region of the substrate surface except the separation region; and forming, on the separation region, a group III nitride compound semiconductor material having another crystal structure inclusive of an amorphous structure except the single crystal structure.

(122) A method according to the paragraph (121), wherein the separation region is formed by forming a level difference on the substrate by wet etching, by forming a level difference on the substrate by scribing or half-cutting due to a dicing blade, or by making the substrate amorphous by ion implanting.

(123) A producing method according to the paragraph (121) or (122), wherein the substrate together with the separation region is divided into devices by functional units.

What is claimed is:

1. A group III nitride compound semiconductor device comprising:

a silicon substrate on which a first environment division and a second environment division are formed; and a plurality of first group III nitride compound semiconductor layers formed on said first environment division so as to serve as effective semiconductor layers, wherein said first environment division comprises a surface of said silicon substrate, said plurality of first group III nitride compound semiconductor layers being formed on said surface, wherein said second environment division comprises silicon oxide formed on said surface of said silicon substrate, and wherein said plurality of first group III nitride compound semiconductor layers comprises a plurality of stacks of first group III nitride compound semiconductor layers, said stacks being separated by said silicon oxide and not connected.

2. A device according to claim 1, wherein said first group III nitride compound semiconductor layers are formed on said first environment division directly on an exposed surface of said substrate.

3. A device according to claim 2, wherein said plurality of first group III nitride compound semiconductor layers are not grown on said second environment division.

4. A device according to claim 2, further comprising:

a second group III nitride compound semiconductor layer, which is at least one of amorphous and different in crystallinity from said first group III nitride compound semiconductor layers, grown on said second environment division.

5. The device according to claim 1, wherein said plurality of first group III nitride compound semiconductor layers are formed only on said first environment division.

6. The device according to claim 1, wherein said first environment division comprises a rounded shape.

7. The device according to claim 1, wherein each of said stacks being individually and separately formed on said first environment division.

8. The device according to claim 1, wherein a thickness of said plurality of first group III nitride compound semiconductor layers is less than a thickness of said separating layer.

9. A semiconductor device structure having a first portion and a plurality of second portions, said structure comprising:
   a silicon substrate;
   a silicon oxide separating layer formed on surface of said substrate and defining a plurality of openings respectively formed in said plurality of second portions; and
   a plurality of stacks of group III nitride compound layers which are respectively formed on said surface in said plurality of openings,
   wherein said plurality of stacks of group III nitride compound semiconductor layers are separated by said separating layer and not connected.

10. The structure according to claim 9, wherein said plurality of openings comprises one of a square and a rectangle, having a side with a length in a range from 100 to 1000 $\mu$m.

11. The structure according to claim 9, wherein said plurality of openings comprises one of a square and a rectangle, having a side with a length in a range from 200 to 800 $\mu$m.

12. The structure according to claim 9, wherein said separating layer has a thickness of about 5.5 $\mu$m.

13. The structure according to claim 9, wherein a distance between adjacent ones of said openings is about 50 $\mu$m.

14. The structure according to claim 9, further comprising:
   an undercoat layer comprising one of a metal and a metal nitride formed over said substrate in said plurality of openings.

15. The structure according to claim 9, wherein each opening of said plurality of openings has a rounded shape.

16. The structure according to claim 9, wherein said separating layer is formed directly on said substrate.

17. The structure according to claim 9, wherein said group III nitride compound semiconductor layers are not formed on said separating layer.

18. The structure according to claim 9, wherein said plurality of openings comprises one of a square having rounded corners and a rectangle having rounded corners.

19. The structure according to claim 9, wherein a bottom of said plurality of openings is defined by said surface of said silicon substrate.

20. A method of forming a semiconductor device structure having a first portion and a plurality of second portions, said method comprising:
   forming a silicon oxide separating layer over a surface of a silicon substrate;
   forming a mask over said separating layer;
   etching said separating layer using said mask to create a plurality of openings in said separating layer; and
   forming a plurality of group III nitride compound semiconductor layers on said surface of said silicon substrate in said plurality of openings,
   wherein said plurality of group III nitride compound semiconductor layers comprises a plurality of stacks of group III nitride compound semiconductor layers, said stacks being separated by said separating layer and not connected.

21. The method according to claim 20, wherein said forming said separating layer over said substrate comprises forming said separating layer directly on said substrate, and
   wherein said forming said mask over said separating layer comprises forming said mask directly on said separating layer.

22. A method of forming a group III nitride compound semiconductor device, said method comprising:
   forming amorphous portions of a silicon substrate surface in a grid-shaped pattern by implanting ions in said silicon substrate surface; and
   forming a group III nitride compound semiconductor layer on said substrate surface such that a portion of said layer formed on said amorphous portions of said substrate surface has a different crystalline structure than a portion of said layer formed on portions of said substrate surface that are other than said amorphous portions,
   wherein said portion of said group III nitride compound semiconductor layer formed on said amorphous portions of said substrate surface is not connected to a portion of said layer formed on said portions of said substrate surface that are other than said amorphous portions.

23. The method according to claim 22, wherein said portions of said substrate surface that are other than said amorphous portions comprise square-shaped portions formed between said amorphous portions having said grid-shaped pattern.

24. The method according to claim 22, wherein said portion of said group III nitride compound semiconductor layer formed on said amorphous portions of said substrate surface comprises a columnarly grown portion.

* * * * *